US008253414B2

(12) United States Patent
Ausserlechner

(10) Patent No.: US 8,253,414 B2
(45) Date of Patent: Aug. 28, 2012

(54) INTEGRATED CIRCUIT INCLUDING A MAGNETIC FIELD SENSITIVE ELEMENT AND A COIL

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1278 days.

(21) Appl. No.: 11/965,090

(22) Filed: Dec. 27, 2007

(65) Prior Publication Data

US 2009/0167301 A1 Jul. 2, 2009

(51) Int. Cl.

*G01R 33/02* (2006.01)
*G01R 33/06* (2006.01)
*G01R 33/07* (2006.01)
*G01R 33/09* (2006.01)

(52) U.S. Cl. ........................ 324/252; 324/249; 324/251

(58) Field of Classification Search .................. 324/249, 324/251, 252

See application file for complete search history.

(56) References Cited

U.S. PATENT DOCUMENTS 3,886,446 A 5/1975 Laranov et al.
5,192,877 A * 3/1993 Bittebierre et al. ............. 327/73
5,331,277 A * 7/1994 Burreson ................. 324/207.16
5,373,123 A * 12/1994 Skalski ......................... 187/393
5,952,825 A 9/1999 Wan
7,288,928 B2 10/2007 Shapiro
7,362,098 B2 * 4/2008 Ando et al. ................... 324/258
7,420,365 B2 * 9/2008 Witcraft et al. ............... 324/252
2005/0083032 A1 4/2005 Goldfine et al.
2005/0270831 A1 12/2005 Witcraft et al.
2006/0022670 A1 2/2006 Kumar et al.
2006/0202690 A1 9/2006 Park et al.
2006/0273418 A1 12/2006 Chung et al.
2007/0216408 A1 9/2007 Ando et al.
2008/0012559 A1 1/2008 Heiland
2008/0238410 A1 * 10/2008 Charlier et al. ............... 324/202
2009/0001964 A1 * 1/2009 Strzalkowski ................ 324/202

FOREIGN PATENT DOCUMENTS

DE 10062292 A1 3/2002
WO WO 2005096007 A1 * 10/2005
WO WO 2006034551 A1 * 4/2006

OTHER PUBLICATIONS

Machine English translation of the description DE 10062292, obtained Sep. 21, 2011, 3 pages, from the EPO website (http://worldwide.espacenet.com/advancedSearch?locale=en_ep).*

* cited by examiner

*Primary Examiner* — Jay Patidar
*Assistant Examiner* — David M. Schindler
(74) *Attorney, Agent, or Firm* — Dicke, Billig & Czaja, PLLC

(57) ABSTRACT

An integrated circuit includes a die and a first magnetic field sensitive element formed on the die. The integrated circuit includes a first coil formed on the die and around the first magnetic field sensitive element.

20 Claims, 3 Drawing Sheets

180
122
124a
123
126a
126b
124b 190
148a
126a
152a
146a
144a
142
148b
150a
182
184
154
156
158
160
146b
126b
144b
150b
152b
142164a
188
166
168
170
174
176
OUTPUT
164b
172
124a
186
124b
162a
162b
142

INTEGRATED CIRCUIT INCLUDING A MAGNETIC FIELD SENSITIVE ELEMENT AND A COIL

BACKGROUND

Low frequency magnetic fields less than approximately 10 kHz may be measured with small offset errors by integrated Hall probes. By implementing a spinning current technique, the Hall probes have low flicker noise and are highly linear versus magnetic field (below 400 mT flux density), and are free of hysteresis. By implementing a stress compensation technique, the Hall probes have low lifetime drifts of magnetic sensitivity. Due to the time discrete signal processing of a spinning current technique, the bandwidth of a typical Hall probe is limited to approximately 10 kHz.

High frequency magnetic fields may be measured by air coils. Air coils have low impedance and are highly linear versus magnetic field. For some applications, such as remote or contactless sensing of electric current via its magnetic field, there is considerable interest in magnetic field sensors for wide bandwidths from DC up to 100 kHz.

For these and other reasons, there is a need for the present invention.

SUMMARY

One embodiment provides an integrated circuit. The integrated circuit includes a die and a first magnetic field sensitive element formed on the die. The integrated circuit includes a first coil formed on the die and around the first magnetic field sensitive element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as “top,” “bottom,” “front,” “back,” “leading,” “trailing,” etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
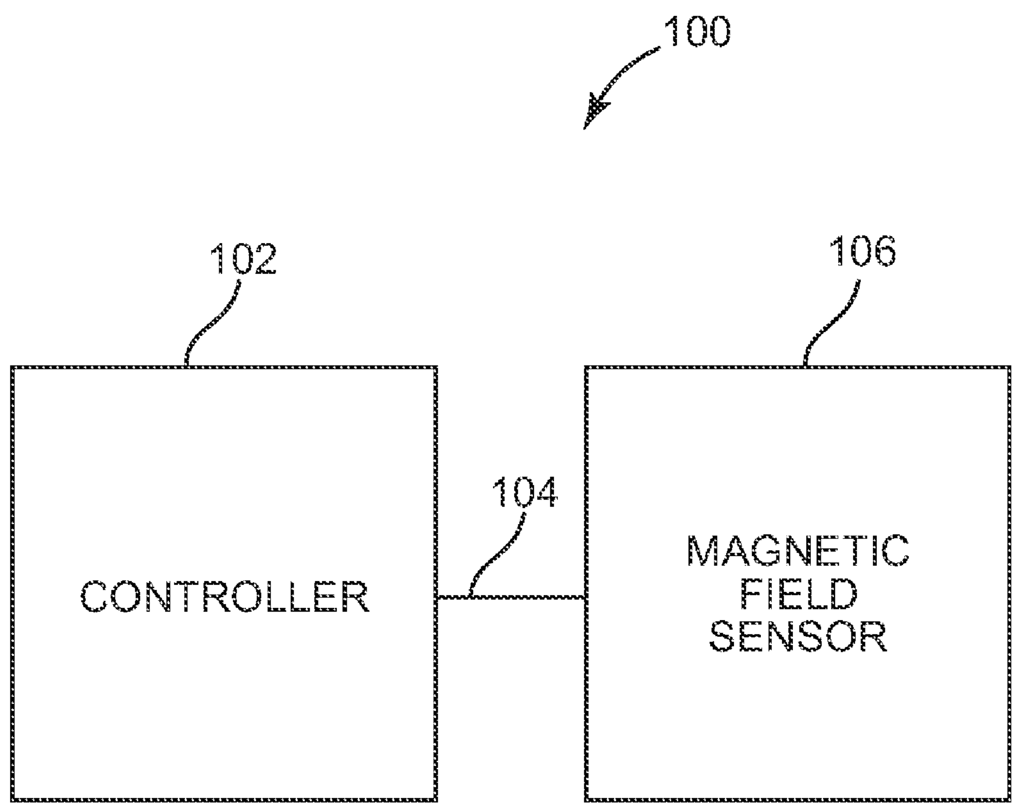
FIG. 1 is a block diagram illustrating one embodiment of a system.

FIG. 1 is a block diagram illustrating one embodiment of a system 100. System 100 includes a controller 102 and a magnetic field sensor 106. In one embodiment, magnetic field sensor 106 is used for remote or contactless sensing of electric current passing through a circuit by measuring the magnetic field generated by the electric current. In other embodiments, magnetic field sensor 106 is used to sense a magnetic field in other suitable applications. In one embodiment, magnetic field sensor 106 is a broadband magnetic field sensor for sensing magnetic fields having frequencies from 0 Hz (i.e., DC) to 100 kHz.

As used herein, the term “electrically coupled” is not meant to mean that the elements must be directly coupled together and intervening elements may be provided between the “electrically coupled” elements.

Controller 102 is communicatively coupled to magnetic field sensor 106 through communication path 104. Controller 102 includes a microprocessor, microcontroller, or other suitable logic circuitry for controlling the operation of magnetic field sensor 106. In one embodiment, controller 102 receives a sensor signal from magnetic field sensor 106 indicating a magnetic field sensed by magnetic field sensor 106.

In one embodiment, magnetic field sensor 106 is an integrated circuit that includes a low frequency magnetic field sensitive element centered within a coil. The coil senses high frequency magnetic fields that are not sensed by the low frequency magnetic field sensitive element. In this embodiment, magnetic field sensor 106 measures the absolute magnetic field acting on the low frequency magnetic field sensitive element and the coil. In another embodiment, magnetic field sensor 106 includes two low frequency magnetic field sensitive elements and two coils in a differential configuration. Each of the low frequency magnetic field sensitive elements is centered within a coil. In this embodiment, magnetic field sensor 106 measures the differential magnetic field acting on the two low frequency magnetic field sensitive elements and the two coils.

The low frequency magnetic field sensitive element measures low frequency magnetic fields having a frequency range from 0 Hz up to approximately 10 kHz. The low frequency magnetic field sensitive element includes a Hall probe, a magneto-resistive (XMR) sensor element, such as an anisotropic magneto-resistive (AMR) sensor element, a giant magneto-resistive (GMR) sensor element, a tunnel magneto-resistive (TMR) sensor element, a magneto-diode, a magneto-transistor (e.g., MAG-FET), or another suitable low frequency magnetic field sensitive element.

The coil measures high frequency magnetic fields having a frequency range from less than 10 kHz up to at least approximately 100 kHz. The frequency range of the coil overlaps the frequency range of the low frequency magnetic field sensitive element. The measurement signals from the low frequency magnetic field sensitive element and the coil are combined to provide a signal indicating the magnetic field acting on the low frequency magnetic field sensitive element and the coil. Therefore, the combination of the low frequency magnetic field sensitive element and the coil provides a broadband magnetic field sensor for measuring magnetic fields having a frequency range from 0 Hz up to at least approximately 100 kHz.

Figure 2:
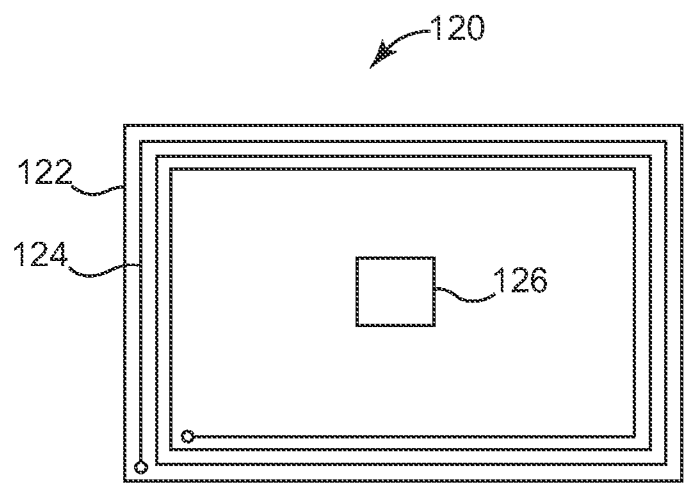
FIG. 2 is a top view illustrating one embodiment of a magnetic field sensor.

FIG. 2 is a top view illustrating one embodiment of a magnetic field sensor 120. In one embodiment, magnetic field sensor 120 provides magnetic field sensor 106 previously described and illustrated with reference to FIG. 1. In one embodiment, magnetic field sensor 120 is an integrated circuit or part of an integrated circuit. Magnetic field sensor 120 includes a die 122, a coil 124, and a magnetic field sensitive element 126.

Coil 124 extends near the edges of the circumference of die 122. Coil 124 does not include means for guiding the magnetic flux of a magnetic field. Coil 124 is formed in interconnect or metallization layers of die 122 using metal lines. The metal lines are formed near the edges of the circumference of die 122 to maximize the area enclosed by coil 124 and thereby increase the magnetic sensitivity of coil 124.

Low frequency magnetic field sensitive element 126 is centered on die 126 and thus is centered within coil 124. In one embodiment, low frequency magnetic field sensitive element 126 includes a Hall probe, an XMR sensor element, a magneto-diode, a magneto-transistor, or another suitable low frequency magnetic field sensitive element.

In one embodiment, where low frequency magnetic field sensitive element 126 includes a Hall probe, the Hall probe signal (Uh) output by the Hall probe is given by:

$$Uh=IH*Si*B \quad \text{Equation I}$$

where:

IH is the current through the Hall probe;

Si is the current related magnetic sensitivity; and

B is the magnetic flux density perpendicular to the surface of die 122.

In one embodiment, IH is approximately 1 mA and Si is approximately 500 V/A/T. Therefore, Uh is approximated by:

$$Uh \approx 0.5*B \quad \text{Equation II}$$

The coil signal (UL) output by the coil is given by:

$$UL=iw*n*A*B \quad \text{Equation III}$$

where:

i is the imaginary unit;

w is the angular frequency of the magnetic field acting on the coil;

n is the number of turns of the coil;

A is the cross-sectional area of a single turn of the coil; and

B is the magnetic flux density perpendicular to the surface of die 122.

The coil signal increases arbitrarily with the frequency of the magnetic field acting on the coil. The coil signal is implicitly high pass filtered such that the amplitude of the coil signal is proportional to the frequency of the magnetic field. In one embodiment, coil 124 includes three turns in each of three interconnect layers for a total of nine turns. In other embodiments, other suitable numbers of turns per interconnect layer and other suitable numbers of interconnects layers are used to provide a coil having a suitable number of turns.

Figure 3:
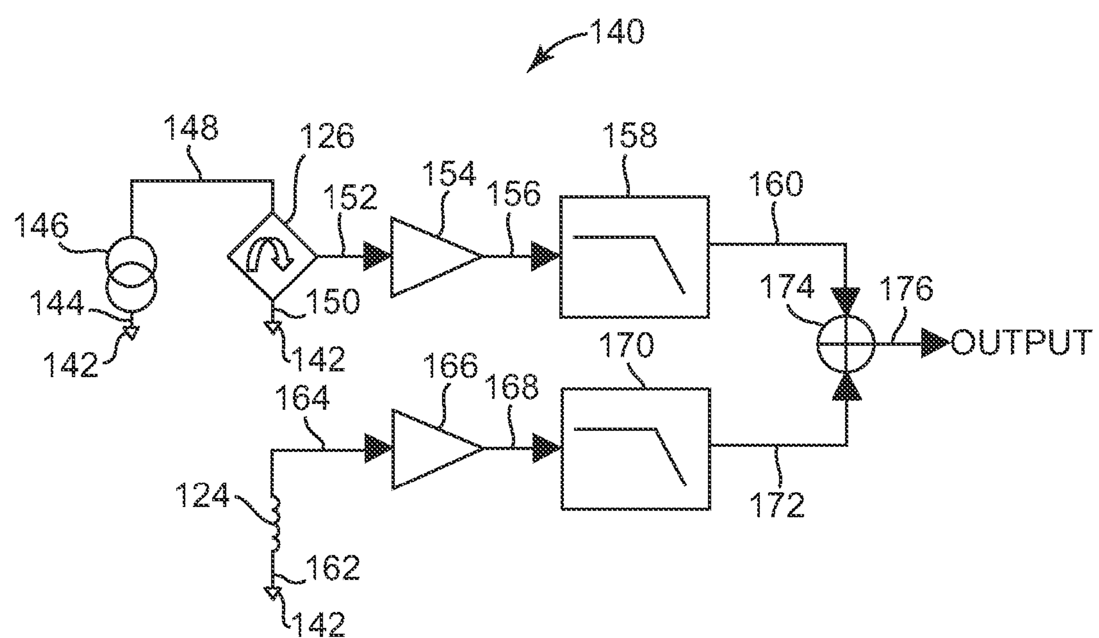
FIG. 3 is a circuit diagram illustrating one embodiment of a magnetic field sensor.

FIG. 3 is a circuit diagram illustrating one embodiment of a magnetic field sensor 140. Magnetic field sensor 140 includes a current source 146, low frequency magnetic field sensitive element 126, coil 124, amplifiers 154 and 166, low pass filters 158 and 170, and a summing block 174. In one embodiment, low frequency magnetic field sensitive element 126 includes a spinning current Hall probe.

One side of current source 146 is electrically coupled to a common or ground 142 through signal path 144. The other side of current source 146 is electrically coupled to an input of spinning current Hall probe 126 through signal path 148. Spinning current Hall probe 126 is electrically coupled to common or ground 142 through signal path 150. The output of spinning current Hall probe 126 is electrically coupled to the input of amplifier 154 through signal path 152. The output of amplifier 154 is electrically coupled to the input of low pass filter 158 through signal path 156. The output of low pass filter 158 is electrically coupled to a first input of summing block 174 through signal path 160.

One side of coil 124 is electrically coupled to common or ground 142 through signal path 162. The other side of coil 124 is electrically coupled to the input of amplifier 166 through signal path 164. The output of amplifier 166 is electrically coupled to the input of low pass filter 170 through signal path 168. The output of low pass filter 170 is electrically coupled to a second input of summing block 174 through signal path 172. The output of summing block 174 provides the OUTPUT signal on OUTPUT signal path 176.

Current source 146 supplies spinning current Hall probe 126. A low frequency magnetic field acting on Hall probe 126 is sensed by Hall probe 126. Hall probe 126 outputs a Hall probe signal indicating the magnetic field to amplifier 154. Amplifier 154 amplifies the Hall probe signal and passes the amplified Hall probe signal to low pass filter 158. Low pass filter 158 low pass filters the amplified Hall probe signal and passes the filtered Hall probe signal to summing block 174. In one embodiment, low pass filter 158 is excluded and amplifier 154 passes the amplified Hall probe signal directly to summing block 174.

A high frequency magnetic field acting on coil 124 induces a voltage in coil 124. Coil 124 outputs the induced voltage coil signal indicating the magnetic field to amplifier 166. Amplifier 166 amplifies the coil signal and passes the amplified coil signal to low pass filter 170. Low pass filter 170 low pass filters the amplified coil signal and passes the filtered coil signal to summing block 174.

Summing block 174 adds the filtered Hall probe signal to the filtered coil signal to provide the OUTPUT signal. The OUTPUT signal represents the magnetic field acting on spinning current Hall probe 126 and coil 124. The OUTPUT signal has a range from DC to high frequencies, such as 100 kHz.

In one embodiment, low pass filter 158 has a −3 dB corner frequency (fg), and low pass filter 170 has a −3 dB corner frequency (fg'). In one embodiment, the corner frequencies fg and fg' are identical. In another embodiment, the corner frequencies fg and fg' are similar and are set to provide low crossover distortion of amplitude, phase, and/or time delay between fg and fg'. In one embodiment, low pass filters 158 and 170 are RC low pass filters of the first order. In other embodiments, low pass filters 158 and 170 are low pass filters of a higher order. In one embodiment, low pass filters 158 and 170 are integrated in amplifiers 154 and 166, respectively. The transfer function (TF) of low pass filters 158 and 170 is given by:

$$TF = \frac{1}{1 + \frac{iw}{wg}} \quad \text{Equation IV}$$

where:

wg is 2*π*fg; and w is 2*π*frequency (f).

Therefore, after filtering and where w>>wg, the filtered coil signal (UL') is approximated by:

$$UL' \approx wg*n*A*B \quad \text{Equation V}$$

Both the Hall probe signal and the coil signal have a flat crossover frequency, hence:

$$Uh=UL' \quad \text{Equation VI}$$

Thus, the corner frequency (fg) is determined by:

$$fg = \frac{0.5}{2*\pi*n*A} \quad \text{Equation VII}$$

In one embodiment, die 122 is 3 mm by 2 mm. Thus the area (A) of die 122 equals 6 $mm^2$ and the circumference equals 10 mm. In one embodiment, coil 124 includes three turns each in three interconnect layers to provide nine turns (i.e., n=9). Therefore, by using equation VII, fg equals 1.5 kHz in this embodiment. The internal resistance of coil 124 should not exceed the resistance of Hall probe 126, which is typically about 2 kOhm. An interconnect layer of die 122 has a typical sheet resistance of about 60 mOhm/square. Therefore, in one embodiment, coil 124 includes 33333 squares. For a coil having three turns each per interconnect layer in three interconnect layers near the circumference of die 122, a coil metal line width of 2.7 μm is obtained. For a 1 μm spacing between adjacent lines, the space used by the metal line is approximately 3*(2.7 μm+1 μm)*10 mm or 0.11 $mm^2$, which is approximately 2% of the total die area. In another embodiment, the resistance of coil 124 is further reduced without using more than 5% of the total die area.

In operation, a magnetic field acting on low frequency magnetic field sensitive element 126 and coil 124 on die 122 is sensed by low frequency magnetic field sensitive element 126 and coil 124. Low frequency magnetic field sensitive element 126 and coil 124 provide signals indicating the magnetic field. The signals are then amplified, low pass filtered, and combined to provide the OUTPUT signal. The OUTPUT signal provides an indication of the magnetic field acting on low frequency magnetic field sensitive element 126 and coil 124 and has a range from 0 Hz up to at least approximately 100 kHz. Therefore, by combining low frequency magnetic field sensitive element 126 and coil 124 into a single die, a broadband magnetic field integrated circuit sensor is provided.

Figure 4:
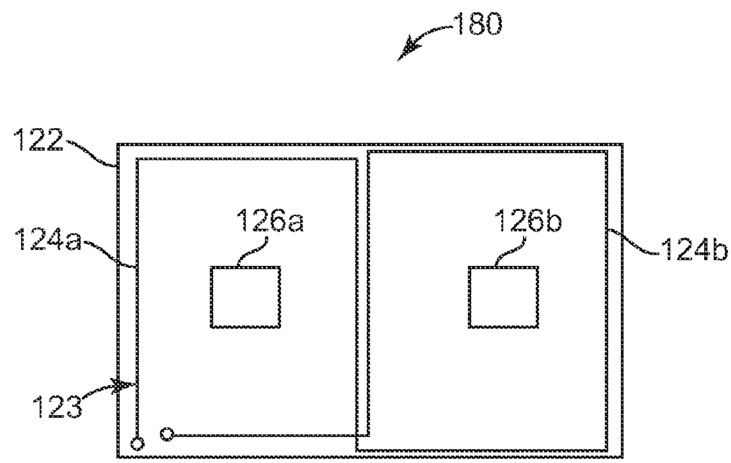
FIG. 4 is a top view illustrating another embodiment of a magnetic field sensor.

FIG. 4 is a top view illustrating another embodiment of a magnetic field sensor 180. In one embodiment, magnetic field sensor 180 provides magnetic field sensor 106 previously described and illustrated with reference to FIG. 1. In one embodiment, magnetic field sensor 180 is an integrated circuit or part of an integrated circuit. Magnetic field sensor 180 includes a die 122, coils 124*a* and 124*b*, and magnetic field sensitive elements 126*a* and 126*b*.

Coils 124*a* and 124*b* extend near the edges of the circumference of die 122 and through the center of die 122. Coils 124*a* and 124*b* do not include means for guiding the magnetic flux of a magnetic field. Coils 124*a* and 124*b* are formed in interconnect or metallization layers of die 122 using metal lines. The metal lines are formed near the edges of the circumference of die 122 and through the center of die 122 to maximize the area enclosed by coils 124*a* and 124*b* and thereby increase the magnetic sensitivity of coils 124*a* and 124*b*. In one embodiment, coils 124*a* and 124*b* are electrically coupled together to form a differential coil 123, which outputs zero volts when a homogeneous magnetic field acts on differential coil 123. Differential coil 123 outputs a voltage when the magnetic field acting on one side (i.e., coil 124*a* or 124*b*) of die 122 is greater than the magnetic field acting on the other side of die 122.

Low frequency magnetic field sensitive element 126*a* is centered within coil 124*a*, and low frequency magnetic field sensitive element 126*b* is centered within coil 124*b*. In one embodiment, magnetic field sensitive elements 126*a* and 126*b* include Hall probes, XMR sensor elements, magneto-diodes, magneto-transistors, or other suitable low frequency magnetic field sensitive elements. In one embodiment, low frequency magnetic field sensitive elements 126*a* and 126*b* are spaced apart from each other by a distance within a range of approximately 1 mm-3 mm. Low frequency magnetic field sensitive elements 126*a* and 126*b* react to magnetic fields with different signs. By subtracting the output signal of low frequency magnetic field sensitive element 126*a* from the output signal of low frequency magnetic field sensitive element 126*b*, the resulting signal represents the difference in the magnetic field acting on the left and right sides of die 122.

Figure 5:
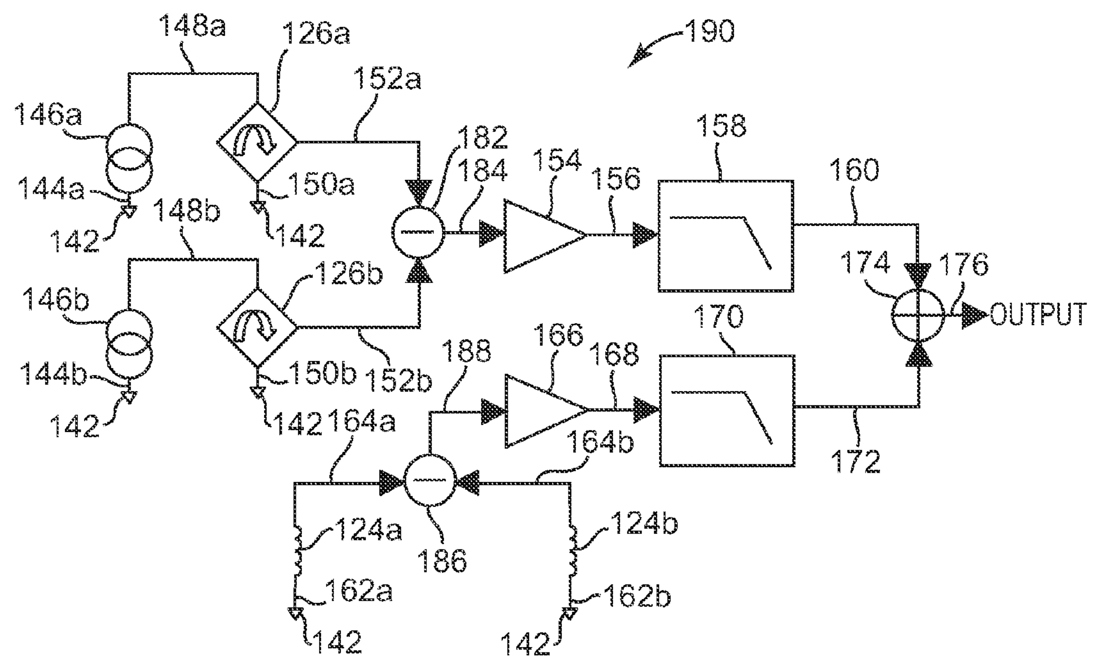
FIG. 5 is a circuit diagram illustrating another embodiment of a magnetic field sensor.

FIG. 5 is a circuit diagram illustrating another embodiment of a magnetic field sensor 190. Magnetic field sensor 190 include current sources 146*a* and 146*b*, low frequency magnetic field sensitive elements 126*a* and 126*b*, coils 124*a* and 124*b*, subtraction blocks 182 and 186, amplifiers 154 and 166, low pass filters 158 and 170, and summing block 174. In one embodiment, low frequency magnetic field sensitive elements 126*a* and 126*b* include spinning current Hall probes.

One side of current source 146*a* is electrically coupled to common or ground 142 through signal path 144*a*. The other side of current source 146*a* is electrically coupled to an input of spinning current Hall probe 126*a* through signal path 148*a*. Spinning current Hall probe 126*a* is electrically coupled to common or ground 142 through signal path 150*a*. The output of spinning current Hall probe 126*a* is electrically coupled to a first input of subtraction block 182 through signal path 152*a*.

One side of current source 146*b* is electrically coupled to common or ground 142 through signal path 144*b*. The other side of current source 146*b* is electrically coupled to an input of spinning current Hall probe 126*b* through signal path 148*b*. Spinning current Hall probe 126*b* is electrically coupled to common or ground 142 through signal path 150*b*. The output of spinning current Hall probe 126*b* is electrically coupled to a second input of subtraction block 182 through signal path 152*b*.

The output of subtraction block 182 is electrically coupled to the input of amplifier 154 through signal path 184. The output of amplifier 154 is electrically coupled to the input of low pass filter 158 through signal path 156. The output of low pass filter 158 is electrically coupled to a first input of summing block 174 through signal path 160.

One side of coil 124*a* is electrically coupled to common or ground 142 through signal path 162*a*. The other side of coil 124*a* is electrically coupled to a first input of subtraction block 186 through signal path 164*a*. One side of coil 124*b* is electrically coupled to common or ground 142 through signal path 162*b*. The other side of coil 124*b* is electrically coupled to a second input of subtraction block 186 through signal path 164*b*.

The output of subtraction block 186 is electrically coupled to the input of amplifier 166 through signal path 188. The output of amplifier 166 is electrically coupled to the input of low pass filter 170 through signal path 168. The output of low pass filter 170 is electrically coupled to a second input of summing block 174 through signal path 172. The output of summing block 174 provides the OUTPUT signal on OUTPUT signal path 176.

Current source 146*a* supplies spinning current Hall probe 126*a*. Current source 146*b* supplies spinning current Hall probe 126*b*. A low frequency magnetic field acting on Hall probes 126*a* and 126*b* is sensed by Hall probes 126*a* and 126*b*. Hall probes 126*a* and 126*b* each output a Hall probe signal indicating the magnetic field to subtraction block 182. Subtraction block 182 subtracts one of the Hall probe signals from the other of the Hall probe signals to provide a Hall probe difference signal indicating the difference between the Hall probe signals. The Hall probe difference signal is passed to amplifier 154.

Amplifier 154 amplifies the Hall probe difference signal and passes the amplified Hall probe difference signal to low pass filter 158. Low pass filter 158 low pass filters the amplified Hall probe difference signal and passes the filtered Hall probe difference signal to summing block 174. In one embodiment, low pass filter 158 is excluded and amplifier 154 passes the amplified Hall probe difference signal directly to summing block 174.

A high frequency magnetic field acting on coils 124*a* and 124*b* induces a voltage in each coil 124*a* and 124*b*. In one embodiment, each coil 124*a* and 124*b* outputs an induced voltage coil signal indicating the magnetic field to subtraction block 186. Subtraction block 186 subtracts one of the coil signals from the other of the coil signals to provide a coil difference signal indicating the difference between the coil signals. In another embodiment, where a differential coil such as 123 is used, subtraction block 186 is excluded and the voltage signal output by the differential coil is the coil difference signal. The coil difference signal is passed to amplifier 166.

Amplifier 166 amplifies the coil difference signal and passes the amplified coil difference signal to low pass filter 170. Low pass filter 170 low pass filters the amplified coil difference signal and passes the filtered coil difference signal to summing block 174. Summing block 174 adds the filtered Hall probe difference signal to the filtered coil difference signal to provide the OUTPUT signal. The OUTPUT signal represents the difference in the magnetic field acting on spinning current Hall probe 126*a* and coil 124*a* and on spinning current Hall probe 126*b* and coil 124*b*. The OUTPUT signal has a range from DC to high frequencies, such as 100 kHz.

In operation, a magnetic field acting on low frequency magnetic field sensitive elements 126*a* and 126*b* and coils 124*a* and 124*b* on die 122 is sensed by low frequency magnetic field sensitive elements 126*a* and 126*b* and coils 124*a* and 124*b*. Low frequency magnetic field sensitive elements 126*a* and 126*b* and coils 124*a* and 124*b* provide signals indicating the magnetic field. The difference in the magnetic fields acting on the right and left sides of die 122 is then determined to provide difference signals. The difference signals are amplified, low pass filtered, and combined to provide the OUTPUT signal. The OUTPUT signal provides an indication of the differential magnetic field acting on low frequency magnetic field sensitive elements 126*a* and 126*b* and coils 124*a* and 124*b*. The OUTPUT signal has a range from 0 Hz up to at least approximately 100 kHz. Therefore, by combining low frequency magnetic field sensitive elements 126*a* and 126*b* and coils 124*a* and 124*b* into a single die, a differential broadband magnetic field integrated circuit sensor is provided.

Embodiments provide a broadband magnetic field sensor integrated on a single die. The broadband magnetic field sensor can be fabricated at low cost since the sensor fabrication is compatible with integrated circuit technology. In addition, the sensor has a low weight and volume. The sensor has no mechanical parts, thus the sensor has high reliability. Further, since the coil(s) and the low frequency magnetic field sensitive element(s) are on the same die, both the coil(s) and low frequency magnetic field sensitive element(s) experience the same temperature, which improves temperature compensation for both the coil(s) and low frequency magnetic field sensitive element(s). Both the coil(s) and low frequency magnetic field sensitive element(s) can be tested using a standard test procedure for integrated circuits and at different temperatures. The low pass filters for the coil(s) and low frequency magnetic field sensitive element(s) are well matched since they are on the same integrated circuit using the same process spread and temperature. Finally, there is no lateral, vertical, or angular misalignment between the coil(s) and the low frequency magnetic field sensitive element(s) due to the accuracy of lithographic processes. Hence, the coil(s) and the corresponding low frequency magnetic field sensitive element(s) detect substantially identical magnetic field components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:

a die;

a first magnetic field sensitive element formed on the die;

a first coil formed on the die and surrounding the first magnetic field sensitive element;

a first amplifier configured to amplify a first signal from the first magnetic field sensitive element;

a second amplifier configured to amplify a second signal from the first coil;

a first low pass filter configured to filter the amplified first signal to provide a first amplified and filtered first signal; and a second low pass filter configured to filter the amplified second signal to provide a second amplified and filtered second signal.

2. The integrated circuit of claim 1, wherein the first magnetic field sensitive element comprises a spinning current Hall probe.

3. The integrated circuit of claim 1, wherein the first magnetic field sensitive element consists of one of a magneto-resistive sensor element, a magneto-diode, and a magneto-transistor.

4. The integrated circuit of claim 1, wherein the first coil is formed in at least two interconnect layers of the die and includes at least two turns within a single interconnect layer of the die.

5. The integrated circuit of claim 1, further comprising:

a summing block configured to add the first amplified and filtered first signal to the second amplified and filtered second signal to provide a signal indicating a magnetic field acting on the first magnetic field sensitive element and the first coil.

6. The integrated circuit of claim 5, wherein the integrated circuit is configured to sense a magnetic field having a frequency within a range from 0 Hz to 100 kHz.

7. An integrated circuit comprising:

a die;

a first magnetic field sensitive element formed on the die;

a first coil formed on the die and surrounding the first magnetic field sensitive element;

a second magnetic field sensitive element formed on the die; and a second coil formed on the die and around the second magnetic field sensitive element;

a first amplifier configured to amplify a first signal indicating a difference between a signal from the first magnetic field sensitive element and a signal from the second magnetic field sensitive element; and a second amplifier configured to amplify a second signal indicating a difference between a signal from the first coil and a signal from the second coil.

8. The integrated circuit of claim 7, further comprising:

a first low pass filter configured to filter the amplified first signal to provide a first amplified and filtered first signal; and a second low pass filter configured to filter the amplified second signal to provide a second amplified and filtered second signal.

9. The integrated circuit of claim 8, further comprising:

a summing block configured to add the first amplified and filtered first signal to the second amplified and filtered second signal to provide a signal indicating a magnetic field acting on the first magnetic field sensitive element, the second magnetic field sensitive element, the first coil, and the second coil.

10. A system comprising:

a controller; and a magnetic field sensor communicatively coupled to the controller, the magnetic field sensor comprising:

a die;

a first magnetic field sensitive element formed on the die;

a first coil formed on the die and surrounding the first magnetic field sensitive element;

a first amplifier configured to amplify a first signal from the first magnetic field sensitive element;

a second amplifier configured to amplify a second signal from the first coil;

a first low pass filter configured to filter the amplified first signal to provide a first amplified and filtered first signal; and a second low pass filter configured to filter the amplified second signal to provide a second amplified and filtered second signal.

11. The system of claim 10, wherein the first magnetic field sensitive element comprises a spinning current Hall probe.

12. The system of claim 10, wherein the first magnetic field sensitive element consists of one of a magneto-resistive sensor element, a magneto-diode, and a magneto-transistor.

13. The system of claim 10, wherein the magnetic field sensor further comprises:

a second magnetic field sensitive element formed on the die; and a second coil formed on the die and around the second magnetic field sensitive element, the second coil adjacent to the first coil.

14. The system of claim 13, wherein the first coil is electrically coupled to the second coil.

15. The system of claim 10, wherein the magnetic field sensor is configured to sense a magnetic field having a frequency within a range from 0 Hz to 100 kHz.

16. A method for sensing a magnetic field, the method comprising:

providing a first magnetic field sensitive element and a first coil surrounding the first magnetic field sensitive element on a die;

amplifying a first signal from the first magnetic field sensitive element;

amplifying a second signal from the first coil;

low pass filtering the amplified first signal;

low pass filtering the amplified second signal; and outputting a sum of the filtered first signal and the filtered second signal indicating a magnetic field acting on the first magnetic field sensitive element and the first coil.

17. The method of claim 16, wherein providing the magnetic field sensitive element comprises providing a spinning current Hall probe.

18. The method of claim 16, wherein providing the magnetic field sensitive element consists of one of a magneto-resistive sensor element, a magneto-diode, and a magneto-transistor.

19. The method of claim 16, wherein outputting the sum comprises outputting a signal indicating a magnetic field having a frequency within a range of 0 Hz to 100 kHz.

20. A method for sensing a magnetic field, the method comprising:

providing a first magnetic field sensitive element and a first coil surrounding the first magnetic field sensitive element on a die;

outputting a signal indicating a magnetic field acting on the first magnetic field sensitive element and the first coil;

providing a second magnetic field sensitive element and a second coil around the second magnetic field sensitive element on the die; and outputting a signal indicating a difference between a magnetic field acting on the first magnetic field sensitive element and the first coil and the magnetic field acting on the second magnetic field sensitive element and the second coil.

* * * * *